United States Patent [19]

Carpenter et al.

[11] Patent Number: 5,485,672
[45] Date of Patent: Jan. 23, 1996

[54] METHOD FOR ENCASING A PRINTED WIRING BOARD

[75] Inventors: Alton D. Carpenter, Houston; Howard W. Segler, Stafford, both of Tex.

[73] Assignee: Texas Instruments Incorporated, Dallas, Tex.

[21] Appl. No.: 81,494

[22] Filed: Jun. 21, 1993

[51] Int. Cl.⁶ ............................................. H05K 3/30
[52] U.S. Cl. ...................... 29/841; 174/35 R; 174/254; 257/668
[58] Field of Search ............................. 29/846, 830, 892, 29/891; 174/35 R, 254; 439/152

[56] References Cited

U.S. PATENT DOCUMENTS

| | | |
|---|---|---|
| 3,372,310 | 3/1968 | Kantor . |
| 4,386,388 | 5/1983 | Beun . |
| 4,642,735 | 2/1987 | Hodsdon et al. .................. 174/35 R X |
| 4,717,990 | 1/1988 | Tugcu ................ 174/35 R X |
| 4,789,347 | 12/1988 | Banjo et al. . |
| 4,798,946 | 1/1989 | Fujii et al. . |
| 4,811,165 | 3/1989 | Currier et al. . |
| 4,838,804 | 6/1989 | Banjo et al. . |
| 4,854,883 | 8/1989 | Tuckwood . |
| 4,864,116 | 9/1989 | Banjo et al. . |
| 4,872,091 | 10/1989 | Maniwa et al. . |
| 4,889,498 | 12/1989 | Mizuta . |
| 4,941,835 | 7/1990 | Lasmayoux et al. . |
| 4,975,805 | 12/1990 | Schmutzler . |
| 5,170,328 | 12/1992 | Kruppa ............................... 257/668 X |
| 5,179,501 | 1/1993 | Ocken et al. ................ 174/254 X |
| 5,220,488 | 6/1993 | Denes ................ 29/846 X |

*Primary Examiner*—Carl J. Arbes
*Attorney, Agent, or Firm*—William W. Holloway; Leo N. Heiting; Richard L. Donaldson

[57] ABSTRACT

The invention provides an apparatus (10) for encasing a printed wiring board (12). Apparatus (10) comprises a substantially tubular housing (14) having internal ribs (30) formed along first and second sides (32) and (34) of housing (14). Printed wiring board (12) is received in housing (14) and maintained in place by ribs (30). An end cap (18) having an aligning member (36) is placed in a first opening (22) of housing (14). A coupling member (20) comprising a connector (40) and a support shell (42) is inserted into a second opening (28) of housing (14).

6 Claims, 2 Drawing Sheets

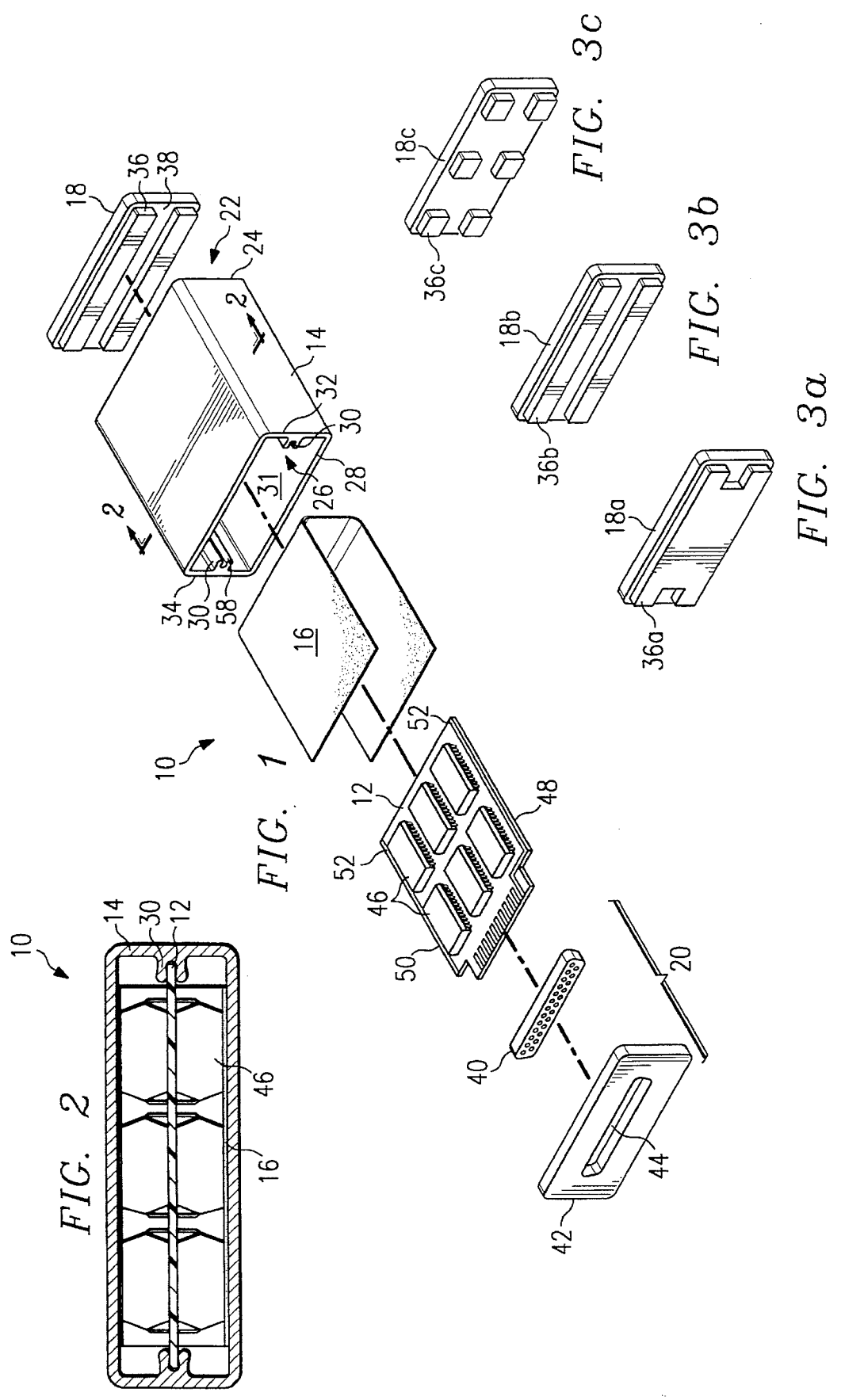

METHOD FOR ENCASING A PRINTED WIRING BOARD

TECHNICAL FIELD OF THE INVENTION

This invention relates in general to the field of electronic devices, and more particularly to a method and apparatus for encasing printed wiring boards.

BACKGROUND OF THE INVENTION

Modular electronic components comprising a printed wiring board, which are used in many modern systems, have been significantly reduced in size in recent years. Modular components provide, for example, memory expansion in personal computers, printer soft fonts for laser printers, preprogrammed electronic firmware, and solid state "disk emulators". A modular component may be coupled to a power supply, control signals, and ground lines of an external system by an electrical connector built into one end of the component. Typical modular components are produced in a size commonly referred to as a "credit card" format. This generic name is derived from the fact these components have a length and a width similar to that of a common credit card, and a thickness of approximately 3 millimeters. Modular electronic components are fragile due to this small size. Additionally, the performance capacity of modular electronic components may be diminished by exposure to high heat, electromagnetic interference, and electrostatic discharges which occur in a typical operating environment.

A prior solution provides a 2-piece external shell or encasement for the modular component to provide mechanical protection, support, electrostatic discharge shielding, electromagnetic interference shielding and heat dissipation. A typical prior encasement for a printed wiring board comprises two molded encasement halves. The printed wiring board is placed between the two encasement halves. The encasement halves are joined together around the printed wiring board using a solvent bonding or ultrasonic welding technology. Due to variations in the size of the printed wiring board and the wide variety of conventional connectors, this prior solution may require creating custom molds for each encasement half to be used with a specific modular component.

Another prior solution uses an encasement formed by two molded segments. A molded bottom segment has structural ribs to support and contain the printed wiring board. With the printed wiring board in place in the bottom segment, a molded top segment is bonded to the molded bottom segment. Thereby, the printed wiring board is locked in the encasement with a connector extending therefrom. This solution also suffers from the drawback that the bottom and top segments may require creating custom molds for each specific modular component.

SUMMARY OF THE INVENTION

In accordance with the present invention, a method and apparatus for encasing printed wiring boards is provided which substantially eliminates or reduces disadvantages and problems associated with prior systems and methods. More particularly, the present invention provides an apparatus for encasing a printed wiring board comprising a substantially tubular housing, a plurality of internal ribs, an end plug and a coupling member. The housing comprises first and second openings at first and second ends of the housing. The end plug is operable to be inserted into the first opening of the housing. The internal ribs are disposed on an internal surface of the housing along the first and second sides of the housing. The printed wiring board is inserted into the first opening of the housing such that the plurality of ribs and the end plug maintain the printed wiring board in place in the housing. The coupling member is operable to be inserted into the second opening of the housing for coupling the printed wiring board with an external system.

A technical advantage of the present invention inheres in the fact that it provides a method for manufacturing a variety of housings for various printed wiring boards using a single mold. This is accomplished by cutting an individual housing produced during an extrusion process at an appropriate length for a particular printed wiring board.

Another technical advantage of the present invention inheres in the fact that it provides a high volume, cost effective method for manufacturing housings for printed wiring boards providing electromagnetic and electrostatic discharge shielding by extruding plastic housings containing electrically conductive fiber.

Another technical advantage of the present invention inheres in the fact that it provides external and internal ribs to reinforce the strength of the housing and to assure proper alignment of the housing with a specific external system.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 is an exploded isometric view of an apparatus for encasing a printed wiring board constructed according to the teachings of the present invention;

FIG. 2 is a cross-section along lines 2—2 of FIG. 1 of an apparatus for encasing a printed wiring board constructed according to the teachings of the present invention;

FIGS. 3a through 3c illustrate three embodiments of an end plug for use with an apparatus for encasing a printed wiring board constructed according to the teachings of the present invention;

DETAILED DESCRIPTION OF THE INVENTION

Figure 4A:
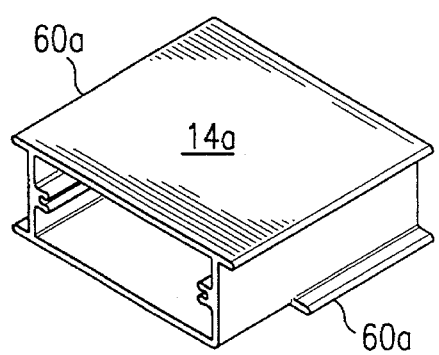
FIGS. 4a through 4c are cross-sections of three embodiments of a housing having external ribs for aligning an apparatus for encasing a printed wiring board With an external system constructed according to the teachings of the present invention.

FIG. 1 is an exploded view of an apparatus indicated generally at 10 for encasing a printed wiring board 12. Apparatus 10 comprises a substantially tubular housing 14, an adhesive sheet 16, an end plug 18 and a coupling member 20.

Housing 14 comprises a first opening 22 at a first end 24 and a second opening 26 at a second end 28. Housing 14 may be formed by extruding a plastic material having electrically conductive fibers therein through a mold (not shown) using conventional techniques. First opening 22 of housing 14 is operable to receive end plug 18. Second opening 26 of housing 14 is operable to receive coupling member 20. Housing 14 further comprises a plurality of internal ribs 30 formed on an inner surface 31 along first side 32 and second side 34 of housing 14. As shown in FIG. 1, a plurality of internal ribs 30 comprises two pair of ribs wherein one pair of ribs 30 is formed along first side 32 of housing 14 and a second pair of ribs 30 is formed along second side 34 of housing 14 such that printed wiring board 12 may be inserted into housing 14 and maintained in place by internal ribs 30. In this embodiment, the two ribs 30 found on first side 32 are spaced apart such that printed wiring board 12 fits snugly between ribs 30. Similarly, the two ribs 30 formed on second side 34 are spaced apart such that printed wiring board 12 fits snugly between ribs 30. Alternatively, internal ribs 30 may comprise another appropriate number of ribs sufficient to maintain printed wiring board 12 in place in housing 14.

End plug 18 is operable to be inserted into first opening 22 of housing 14 and member 20 is operable to be inserted into second opening 26 of housing 14. End plug 18 further comprises an aligning body 36 formed on a surface 38 of end plug 18. Aligning body 36 is operable to provide support and to align printed wiring board 12 in housing 14. Additionally, end plug 18 may comprise an electrically dissipative plastic. Various embodiments of an end plug 18a, 18b, and 18c with aligning bodies 36a, 36b, and 36c are shown in FIG. 3a through 3c respectively.

Coupling member 20 may comprise a conventional connector 40 and a support shell 42. Connector 40 may comprise, for example, a 9 pin, 44 pin, or other suitable conventional connector used for coupling printed wiring board 12 with an external system. Support shell 42 comprises an opening 44 for receiving connector 40. Support shell 42 may comprise, for example, an electrically dissipative plastic material. A variety of support shells 42 each operable to receive a particular conventional connector 40 may be fabricated for use with a housing 14; each shell 42 having a standard cross-section operable to fit in first opening 22 of housing 14.

Printed wiring board 12 may comprise, for example, a plurality of electrical components 46 solder connected to first side 48 and second side 50 of printed wiring board 12. For example, printed wiring board 12 may comprise a memory card. Additionally, printed wiring board 12 may comprise ground wires 52 formed along first edge 54 and second edge 56 of printed wiring board 12. Ground wires 52 are operable to couple with contacts 58 formed on internal ribs 30 of housing 14 when printed wiring board 12 is inserted into housing 14. Thereby, housing 14 may operate to provide electrostatic discharge and electromagnetic interference shielding for printed wiring board 12. Ground wires 52 of printed wiring board 12 may be connected to a ground pin of connector 40.

Apparatus 10 may be manufactured by cutting adhesive sheet 16 from a piece of an adhesive material operable to melt at a predetermined temperature. Adhesive sheet 16 is folded into a U-shape. Adhesive sheet 16 is placed around printed wiring board 12 to cover first and second sides 48 and 50 of printed wiring board 12. Tubular housing 14 is extruded from a plastic material reinforced with electrically conductive fiber and cut to an appropriate length to house printed wiring board 12. Printed wiring board 12, covered with adhesive sheet 16, is inserted into housing 14 such that first and second edges 54 and 56 of printed wiring board 12 are received between internal ribs 30 of housing 14 and coupling member 20 is received in second opening 28 of housing 14. End plug 18 is inserted into first opening 22 of housing 14. The assembled apparatus 10 may be further heated such that the printed wiring board 12 is held in place within housing 14 by adhesive sheet 16.

FIG. 2 is a cross section of an assembled apparatus 10 taken along a line 2—2 of FIG. 1. Printed wiring board 12 is held in place in housing 14 by ribs 30 and adhesive sheet 16. As shown, printed wiring board 12 engages ribs 30 such that contacts 58 of ribs. 30 engage ground wires 52 of printed wiring board 12. In this manner, housing 14 is operable to provide electrostatic discharge and electromagnetic interference shielding for printed wiring board 12. Electrically conductive fibers disposed in housing 14 conduct electricity through contacts 58 to ground wires 52 to a system ground via a ground pin of connector 40 thereby shielding the circuitry of printed wiring board 12 within housing 14. Finally, adhesive sheet 16 maintains printed wiring board 12 in place by engaging components 46 on both first and second sides 48 and 50 of printed wiring board 12 and housing 14.

Figure 4B:
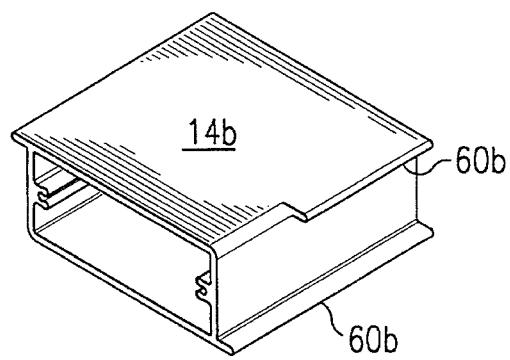
Figure 4C:
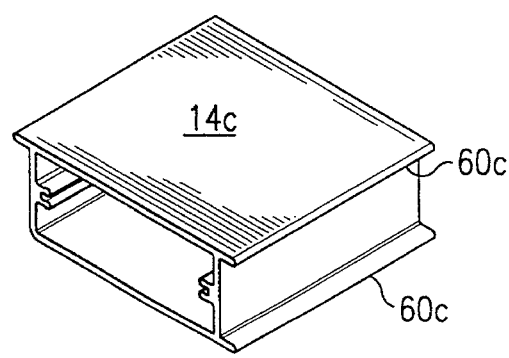

FIGS. 4a through 4c illustrate three embodiments of a housing 14 labelled 14a, 14b, and 14c having external ribs 60a, 60b, and 60c respectively and constructed according to the teachings of the present invention. External ribs 60a, 60b, and 60c strengthen housings 14a, 14b, and 14c by providing increased mechanical support for housings 14a, 14b, and 14c. Additionally, external ribs 60a, 60b, and 60c may be used to provide for proper alignment of housings 14a, 14b, and 14c with an external system. External ribs 60a, 60b, and 60c also provide for proper alignment of housings 14a, 14b, and 14c by requiring a specific structural match between housings 14a, 14b, and 14c and the external system. Therefore, an external system will not accept a housing 14a, 14b, or 14c with the wrong external rib configuration at second opening 28a, 28b, or 28c. Thereby, external ribs 60a, 60b, and 60c of housings 14a, 14b, and 14c allow only an appropriate housing 14a, 14b, or 14c to be connected to a given external system. In this manner, external ribs 60a, 60b, and 60c perform a "polarization" function.

Figure 5A:
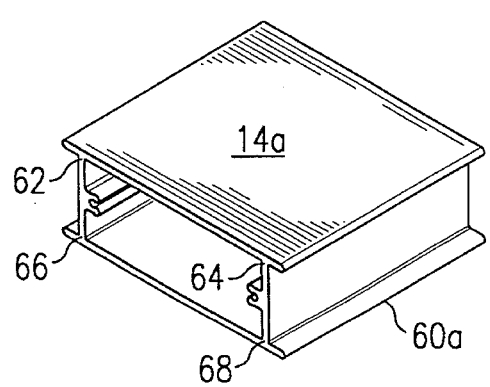
FIGS. 5a and 5b are sequential isometric drawings illustrating a method of manufacturing the housing of FIG. 4a according to the teachings of the present invention.
Figure 5B:
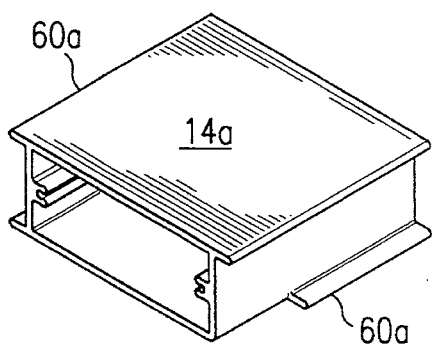

FIGS. 5a and 5b illustrate a method for producing an appropriate combination of external ribs 60a on housing 14a of FIG. 4a. External ribs 60a may be formed at first corner 62, second corner 64, third corner 66 and/or fourth corner 68 of housing 14a during the extrusion process. A portion of external rib 60a at corner 68 of housing 14a may be removed by a conventional machining process. In a similar manner, portions of other ribs 60a may be removed to provide housing 14a with an appropriate configuration at end 28a for a different specific external system.

Figure 6:
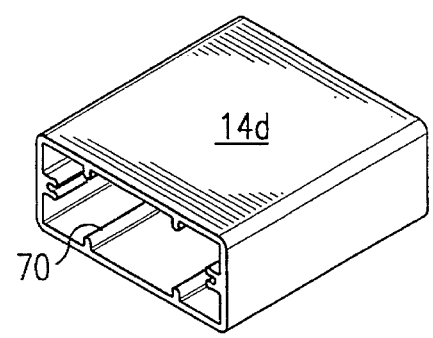
FIG. 6 is a cross-section of an embodiment of an apparatus for encasing a printed wiring board having internal ribs for aligning the apparatus with an external system constructed according to the teachings of the present invention.

FIG. 6 illustrates an embodiment of housing 14, labelled 14d, having internal ribs 70 constructed according to the teachings of the present invention. Internal ribs 70 may be formed on inner surface 31 of housing 14 during the extrusion process. Internal ribs 70 thereby strengthen housing 14d by providing increased mechanical support for housing 14d. Additionally, internal ribs 70 may be fabricated to perform the polarization function described previously with respect to FIGS. 4a through 4c.

Although the present invention has been described in detail, it should be understood that various changes, substitutions and alterations can be made hereto without departing from the spirit and scope of the invention as defined by the appended claims.

What is claimed is:

1. A method for encasing a printed wiring board comprising the steps of:

covering the printed wiring board with an adhesive material;

extruding a housing having an internal surface, first and second ends, first and second sides, and first and second openings at the first and second ends thereof from a plastic material reinforced with electrically conductive fiber;

cutting the housing to an appropriate length for the printed wiring board;

inserting the covered printed wiring board into the second opening of the housing such that the printed wiring board is held in place by internal ribs disposed on the internal surface of the housing; and inserting an end plug into the first opening and a coupling member into the second opening of the housing such that the printed wiring board is held in place within the housing.

2. The method of claim 1, wherein the step of covering the printed wiring board comprises the steps of:

cutting a piece of an adhesive material operable to melt at a predetermined temperature;

folding the cut adhesive material into a U-shape; and covering the printed wiring board with the folded adhesive material such that components on a first side and a second side of the printed wiring board are covered with the adhesive material.

3. The method of claim 1, and further comprising the step of heating the assembly such that the printed wiring board is held in place within the housing by the adhesive material.

4. The method of claim 1, and further comprising the step of forming a member comprising a connector operable to couple the printed wiring board with an external system and a support shell having an opening, the support shell operable to receive the connector, to maintain the connector in contact with the printed wiring board and to be inserted into the second opening of the housing.

5. The method of claim 1, wherein the step of extruding a housing comprises extruding a housing having external ribs disposed on an outer surface of the housing for providing support to the housing and operable to provide proper alignment of the apparatus with an external system.

6. The method of claim 1, and further comprising the step of forming contacts disposed in the internal ribs and operable to contact grounded metal stripes on an edge of the printed wiring board such that the housing provides electrostatic discharge and electromagnetic interference shielding for the printed wiring board.

* * * * *